(12) United States Patent
Brigham et al.

(10) Patent No.: US 12,017,586 B2
(45) Date of Patent: Jun. 25, 2024

(54) REARVIEW ASSEMBLY HAVING CAPACITIVE TOUCH ZONE

(71) Applicant: Gentex Corporation, Zeeland, MI (US)

(72) Inventors: Joseph P. Brigham, Saugatuck, MI (US); Jochen Peter, Hamilton, MI (US); Matthew P. Waligorski, Grand Haven, MI (US); Kyle G. Jones, Holland, MI (US); Robert R. Turnbull, Holland, MI (US); Gregory J. Nagel, Byron Center, MI (US)

(73) Assignee: GENTEX CORPORATION, Zeeland, MI (US)

(*) Notice: Subject to any disclaimer, the term of this patent is extended or adjusted under 35 U.S.C. 154(b) by 0 days.

(21) Appl. No.: 18/175,964

(22) Filed: Feb. 28, 2023

(65) Prior Publication Data

US 2023/0286438 A1   Sep. 14, 2023

Related U.S. Application Data

(60) Provisional application No. 63/317,721, filed on Mar. 8, 2022.

(51) Int. Cl.
| | |
|---|---|
| *B60R 1/12* | (2006.01) |
| *G06F 3/02* | (2006.01) |
| *H05K 1/02* | (2006.01) |
| *H05K 5/00* | (2006.01) |

(52) U.S. Cl.
CPC .......... *B60R 1/12* (2013.01); *G06F 3/02* (2013.01); *H05K 1/0296* (2013.01); *H05K 5/0018* (2022.08); *B60R 2001/1223* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 9,744,907 B2 | 8/2017 | Boehm | |
| 11,256,374 B2 | 2/2022 | Lundy et al. | |
| 2014/0022390 A1* | 1/2014 | Blank | B60R 1/02 348/148 |
| 2016/0062513 A1 | 3/2016 | Turnbull | |

* cited by examiner

*Primary Examiner* — Ifedayo B Iluyomade
(74) *Attorney, Agent, or Firm* — Price Heneveld LLP; Brian James Brewer

(57) ABSTRACT

A rearview assembly for a vehicle is provided that includes: a housing; a rearview element configured to display images of a scene to the rear of the vehicle, the rearview element disposed in the housing; a circuit board mounted in the housing behind the rearview element, the circuit board having a substantially planar surface and a peripheral edge; and a capacitive touch zone on a surface of the housing, the capacitive touch zone comprising a conductive component mounted to the circuit board, wherein the conductive component comprises a first portion mounted to the planar surface of the circuit board and a second portion extending beyond the peripheral edge of the circuit board at an angle to the planar surface.

19 Claims, 5 Drawing Sheets

REARVIEW ASSEMBLY HAVING CAPACITIVE TOUCH ZONE

CROSS-REFERENCE TO RELATED APPLICATION

This application claims priority under 35 U.S.C. § 119(e) upon U.S. Provisional Patent Application No. 63/317,721, entitled "REARVIEW MIRROR ASSEMBLY HAVING CAPACITIVE TOUCH ZONE" filed on Mar. 8, 2022, by Joseph P. Brigham et al., the entire disclosure of which is incorporated herein by reference.

TECHNOLOGICAL FIELD

The present disclosure relates generally to a rearview assembly for a vehicle and, more particularly, relates to a rearview assembly having a capacitive touch zone.

SUMMARY OF THE INVENTION

In one aspect of the invention, a rearview assembly for a vehicle is provided, comprising: a housing; a rearview element configured to display images of a scene to the rear of the vehicle, the rearview element disposed in the housing; a circuit board mounted in the housing behind the rearview element, the circuit board having a substantially planar surface and a peripheral edge; and a capacitive touch zone on a surface of the housing, the capacitive touch zone comprising a conductive component mounted to the circuit board, wherein the conductive component comprises a first portion mounted to the planar surface of the circuit board and a second portion extending beyond the peripheral edge of the circuit board at an angle to the planar surface.

In another aspect of the invention, a rearview assembly for a vehicle is provided, comprising: a housing; a rearview element configured to display images of a scene to the rear of the vehicle, the rearview element disposed in the housing; a circuit board mounted in the housing behind the rearview element, the circuit board having a substantially planar surface and a peripheral edge; and a capacitive touch zone on a surface of the housing, the capacitive touch zone comprising a conductive component mounted to the circuit board, wherein the conductive component comprises a first portion mounted to the planar surface of the circuit board and a second portion extending beyond the peripheral edge of the circuit board at an angle to the first portion.

In another aspect of the invention, a rearview assembly for a vehicle is provided, comprising: a housing; a rearview element configured to display images of a scene to the rear of the vehicle, the rearview element disposed in the housing; a circuit board mounted in the housing behind the rearview element, the circuit board having a substantially planar surface and a peripheral edge; and a capacitive touch zone on a surface of the housing, the capacitive touch zone comprising a conductive component mounted to the circuit board, wherein the conductive component comprises a first portion mounted to the planar surface of the circuit board and a second portion extending beyond the peripheral edge of the circuit board at an angle to the planar surface, wherein the first portion of the conductive component is flat and is mounted parallel to the planar surface of the circuit board, wherein the capacitive touch zone is configured to, upon the receipt of an appropriate input, one or more of: activate a compass display, initiate Bluetooth pairing activation, and generate a signal to the vehicle.

These and other features, advantages, and objects of the present device will be further understood and appreciated by those skilled in the art upon studying the following specification, claims, and appended drawings.

BRIEF DESCRIPTION OF THE DRAWINGS

The invention will now be described with reference to the following drawings, in which.

DETAILED DESCRIPTION OF EMBODIMENTS

Figure 1:
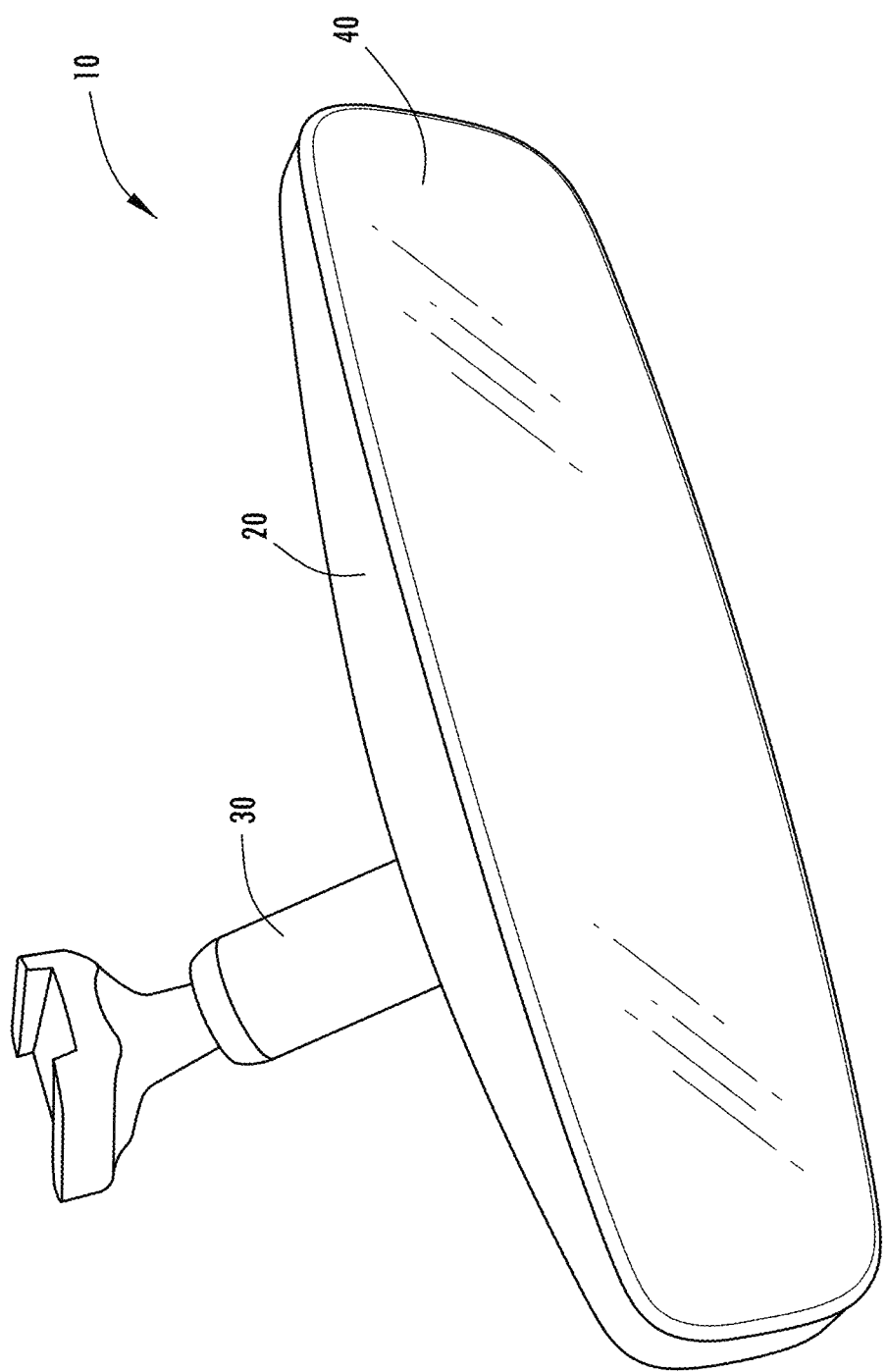
FIG. 1 is a perspective view of a front and top of a rearview assembly according to a first embodiment.

For purposes of description herein, the terms "upper," "lower," "right," "left," "rear," "front," "vertical," "horizontal," and derivatives thereof shall relate to the invention as oriented in FIG. 1. Unless stated otherwise, the term "front" shall refer to the surface of the element closer to an intended viewer of the rearview assembly, and the term "rear" shall refer to the surface of the element further from the intended viewer of the rearview assembly. However, it is to be understood that the invention may assume various alternative orientations, except where expressly specified to the contrary. It is also to be understood that the specific devices and processes illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

FIG. 1 shows a rearview assembly 10 according to one embodiment. As used herein, a "rearview assembly" is an assembly for attachment to a vehicle that provides a rearward view to the driver of the vehicle. The rearward view may be provided by a mirror element, a display, or a combination of the two.

The rearview assembly 10 is shown as including a housing 20 and a mounting mechanism 30. The mounting mechanism 30 shown is configured for mounting to the inner surface of a front windshield of a vehicle. The mounting mechanism 30 may alternatively be configured for mounting to a header component, an overhead console, or to a windshield-mounted console.

A rearview element 40 is disposed in the housing 20 and extends across the front of the housing 20. The rearview element 40 is configured to provide images of a scene to the rear of the vehicle. The rearview element 40 may be a prismatic mirror element, an electro-optic mirror element, a display element, or a display element having a partially transmissive, partially reflective mirror element in front of the display element.

Figure 2:
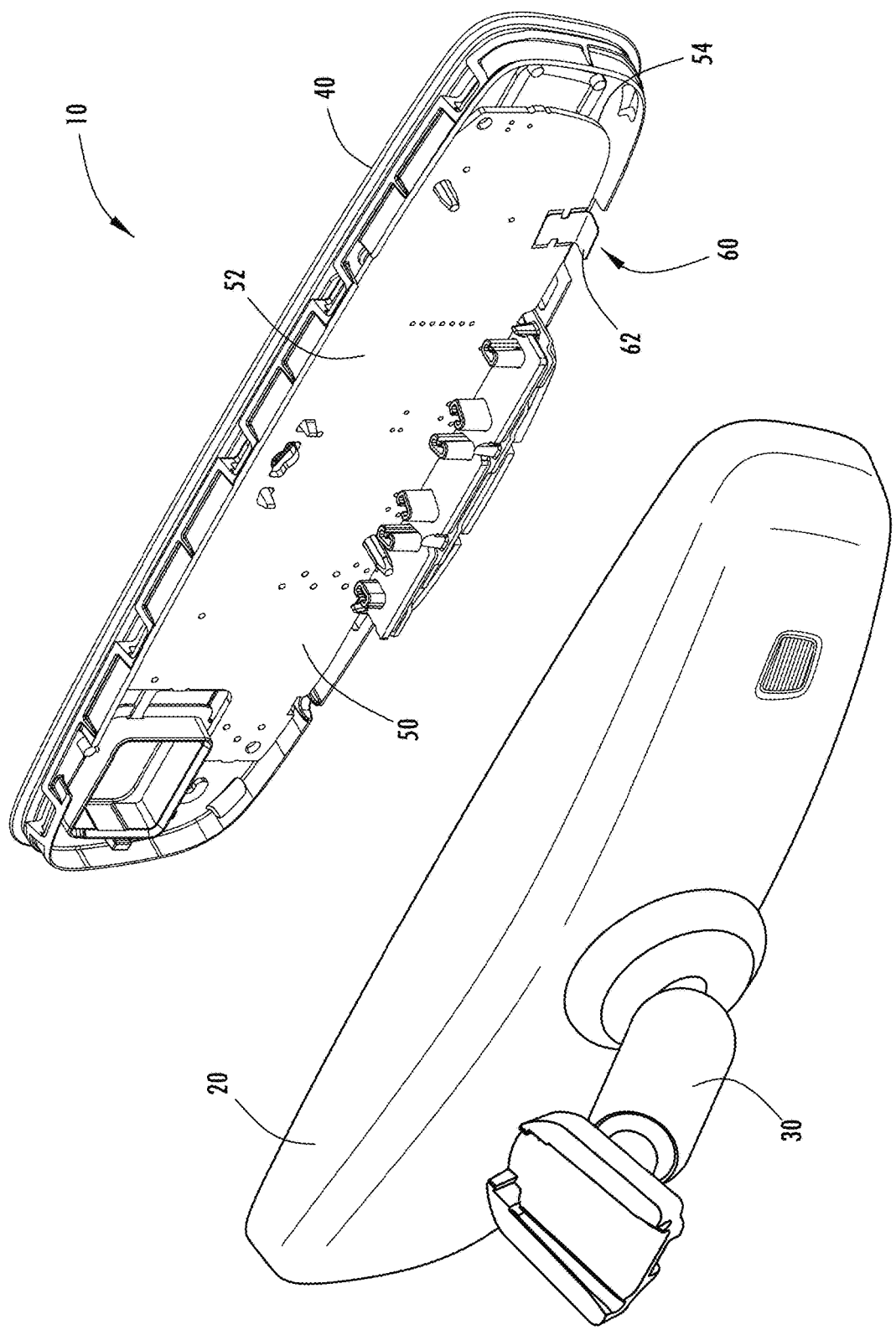
FIG. 2 is a partially exploded view of the rear and top of the rearview assembly shown in FIG. 1.
Figure 3A:
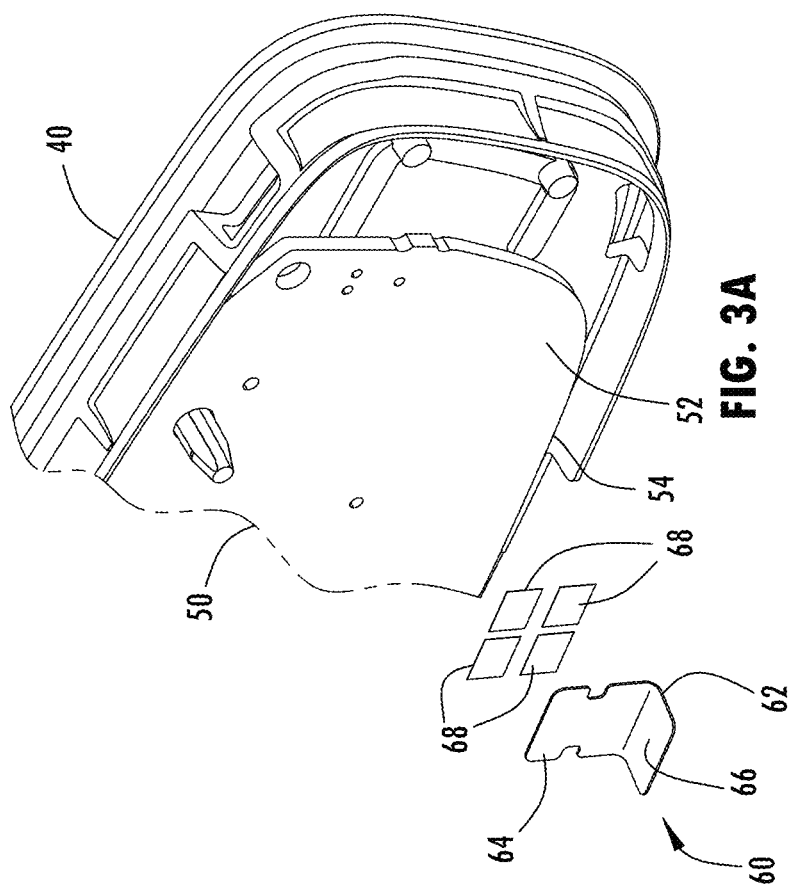
FIG. 3A is an enlarged portion of the partially exploded view shown in FIG. 3 with the capacitive touch zone components shown exploded.
Figure 3:
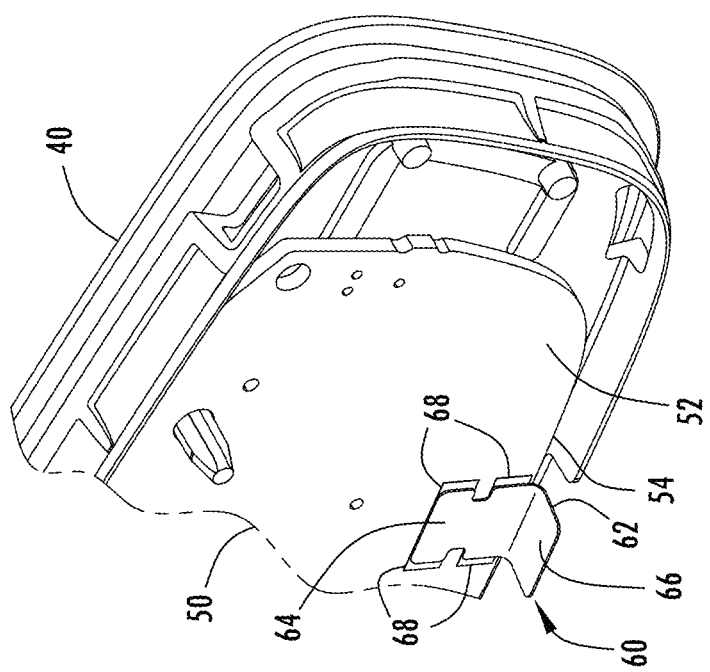
FIG. 3 is an enlarged portion of the partially exploded view shown in FIG. 2.

As shown in FIGS. 2, 3, and 3A, the rearview assembly 10 also includes a circuit board 50 mounted in the housing 20 behind the rearview element 40. The circuit board 50 has a substantially planar surface 52 and a peripheral edge 54. Various electronic elements may be provided on the circuit board 50, such as any one or combination of: a compass circuit, a mirror reflectivity control circuit, a trainable garage door opener circuit, a display driver circuit, an image processing circuit, image sensors, light sensors, microphone(s), map lights, vehicle bus interfaces, Bluetooth communication circuitry, WiFi communication circuitry, etc.

Figure 4:
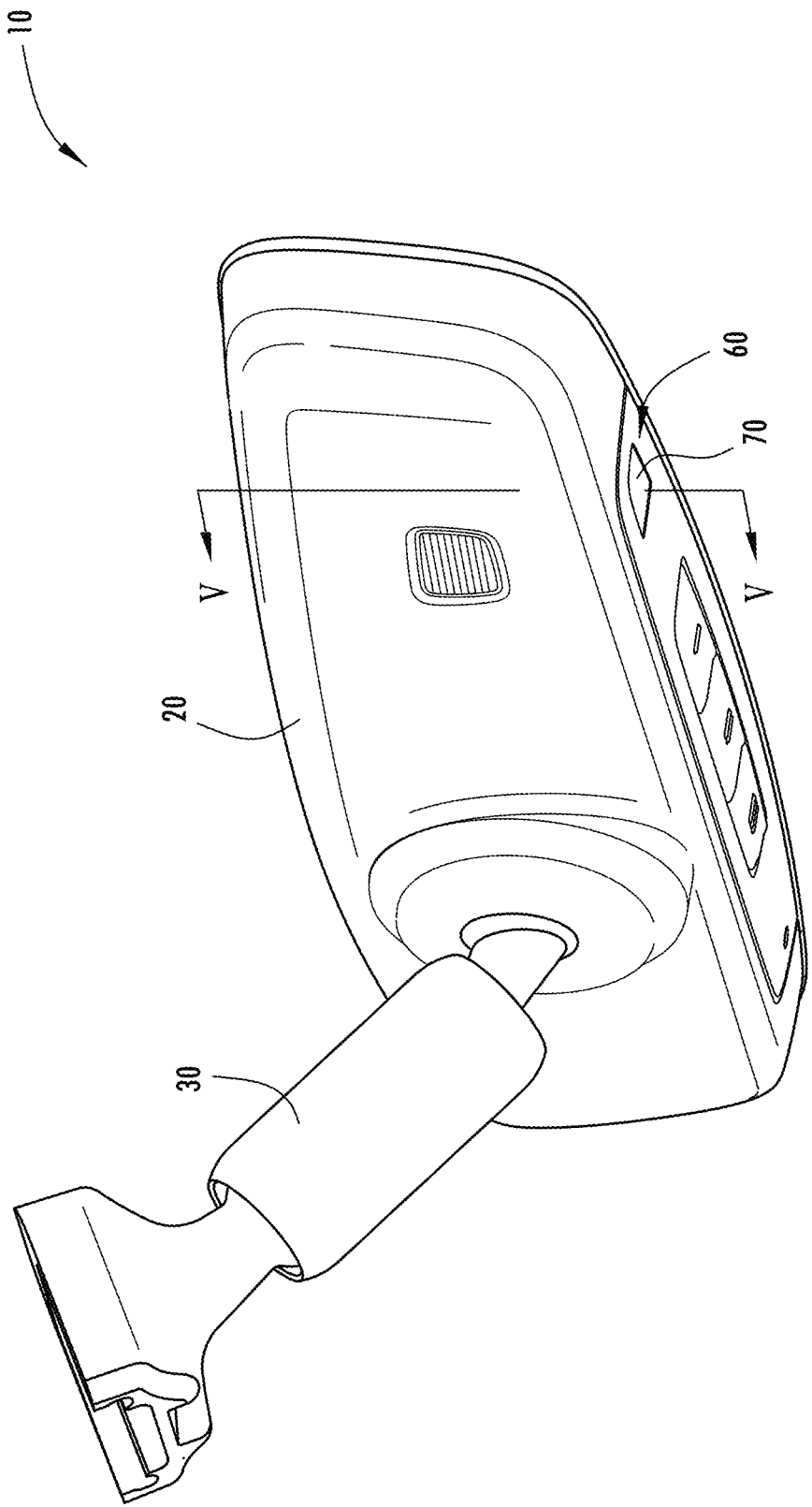
FIG. 4 is a perspective view of the rear and bottom of the rearview assembly shown in FIGS. 1-3A.
Figure 5:
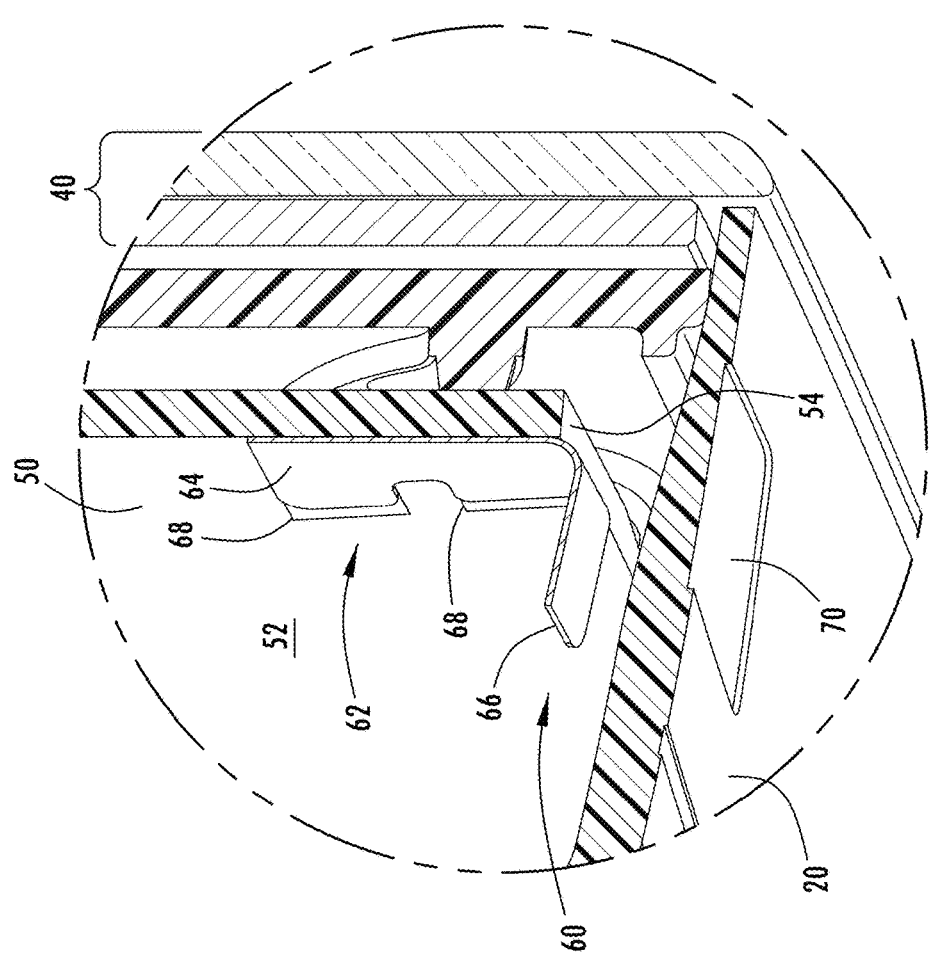
FIG. 5 is a cross-sectional view of a portion of the rearview assembly taken along line V-V in FIG. 4.

As best shown in FIGS. 4 and 5, the rearview assembly 10 also includes one or more capacitive touch zones 60 on a surface of the housing 20. As shown in FIGS. 2, 3, 3A, and 5, the capacitive touch zone 60 includes a conductive component 62 mounted to the circuit board 50. The conductive component 62 includes a first portion 64 mounted to the planar surface 52 of the circuit board 50 and a second portion 66 extending beyond the peripheral edge 54 of the circuit board 50 at an angle to the planar surface 52.

The first portion 64 of the conductive component 62 may be flat and may be mounted parallel to the planar surface 52 of the circuit board 50. The second portion 66 of the conductive component 62 may be flat. The second portion 66 of the conductive component 62 may extend at an angle relative to the planar surface 52 of the circuit board 50 of between 0° and 180°, or more particularly, substantially 90°. The angle used may depend upon the angle of the surface 52 of the circuit board 50 relative to the angle of the surface of the housing 20 where the touch zone 60 is located so that the second portion 66 extends substantially parallel to the surface of the housing 20 at the touch zone 60. This helps assure uniform sensitivity across the touch zone 60.

As shown in FIGS. 3 and 3A, one or more conductive pads 68 may be mounted between the circuit board 50 and the first portion 64 of the conductive component 62.

With reference to FIGS. 4 and 5, the one or more capacitive touch zone 60 may include a recess 70 in the outer surface of the housing 20 to define the zone in which a user should touch the housing 20 to provide an appropriate input to the capacitive touch zone 60. A living hinge may be provided at the recess 70 to provide feedback to the user that the "button" has been pressed. Alternatively, some other marking protruding from or recessed into the housing 20 may be provided so the user can feel the location of the touch zone 60. Alternatively, a graphic may be used to indicate the function of the touch area. If the rearview assembly contains a display, the graphic may be implemented with the display so the touch area function graphics may be changed to handle: multiple languages, multiple level menus or different functional modes.

Multiple capacitive touch zones 60 may be provided having similar construction. The capacitive touch zone(s) 60 may be configured to, upon the receipt of an appropriate input, one or more of: activate/deactivate a map light; activate/deactivate a compass display; toggle between different information to be displayed; initiate Bluetooth pairing activation; generate a signal to another system or component of the vehicle; control electro-optic mirror functions such as dimming level, and dimming on/off; control features of a full display mirror such as brightness, contrast, tilt, and on/off; activate a trainable transmitter to transmit signals to remotely controlled devices; and initiate telematics functions.

Although the capacitive touch zone 60 is shown as being located along the bottom of the housing 20, it may be located on any other portion of the housing 20. In addition, more than one such capacitive touch zones may be provided in the rearview assembly 10.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above are merely for illustrative purposes and not intended to limit the scope of the device, which is defined by the following claims as interpreted according to the principles of patent law, including the Doctrine of Equivalents.

What is claimed is:

1. A rearview assembly for a vehicle, comprising:
a housing having a surface with a touch zone;
a rearview element configured to display images of a scene to the rear of the vehicle, the rearview element disposed in the housing;
a circuit board mounted in the housing behind the rearview element, the circuit board having a substantially planar surface and a peripheral edge; and
a capacitive touch zone on a surface of the housing, the capacitive touch zone comprising a conductive component mounted to the circuit board, wherein the conductive component comprises a first portion mounted to the planar surface of the circuit board and a second portion extending beyond the peripheral edge of the circuit board at an angle to the planar surface,
wherein the first portion of the conductive component is flat and is mounted parallel to the planar surface of the circuit board,
wherein the second portion of the conductive component is flat, and
wherein the angle at which the second portion extends relative to the planar surface of the circuit board is selected such that the second portion extends substantially parallel to the surface of the housing at the touch zone.

2. The rearview assembly of claim 1, wherein the conductive component is supported by the circuit board and the second portion is spaced apart from the housing.

3. The rearview assembly of claim 1, wherein the second portion of the conductive component extends at an angle relative to the planar surface of the circuit board of between 0° and 180°.

4. The rearview assembly of claim 1, wherein the second portion of the conductive component extends at an angle relative to the planar surface of the circuit board of substantially 90°.

5. The rearview assembly of claim 1, wherein the capacitive touch zone is configured to, upon the receipt of an appropriate input, one or more of: activate a compass display, initiate Bluetooth pairing activation, and generate a signal to the vehicle.

6. The rearview assembly of claim 1, wherein the rearview element includes a display device.

7. The rearview assembly of claim 1, wherein the rearview element includes a mirror element.

8. A rearview assembly for a vehicle, comprising:
a housing having a surface with a touch zone;
a rearview element configured to display images of a scene to the rear of the vehicle, the rearview element disposed in the housing;
a circuit board mounted in the housing behind the rearview element, the circuit board having a substantially planar surface and a peripheral edge; and
a capacitive touch zone on a surface of the housing, the capacitive touch zone comprising a conductive component mounted to the circuit board, wherein the conductive component comprises a first portion mounted to the planar surface of the circuit board and a second portion extending beyond the peripheral edge of the circuit board at an angle to the first portion,
wherein the second portion of the conductive component is flat, and
wherein the angle at which the second portion extends relative to the planar surface of the circuit board is selected such that the second portion extends substantially parallel to the surface of the housing at the touch zone.

9. The rearview assembly of claim 8, wherein the first portion of the conductive component is flat and is mounted parallel to the planar surface of the circuit board.

10. The rearview assembly of claim 8, wherein the conductive component is supported by the circuit board and the second portion is spaced apart from the housing.

11. The rearview assembly of claim 8, wherein the second portion of the conductive component extends at an angle relative to the planar surface of the circuit board of between 0° and 180°.

12. The rearview assembly of claim 8, wherein the second portion of the conductive component extends at an angle relative to the planar surface of the circuit board of substantially 90°.

13. The rearview assembly of claim 8, wherein the capacitive touch zone is configured to, upon the receipt of an appropriate input, one or more of: activate a compass display, initiate Bluetooth pairing activation, and generate a signal to the vehicle.

14. The rearview assembly of claim 8, wherein the rearview element includes a display device.

15. The rearview assembly of claim 8, wherein the rearview element includes a mirror element.

16. A rearview assembly for a vehicle, comprising:
a housing having a surface with a touch zone;
a rearview element configured to display images of a scene to the rear of the vehicle, the rearview element disposed in the housing;
a circuit board mounted in the housing behind the rearview element, the circuit board having a substantially planar surface and a peripheral edge; and
a capacitive touch zone on a surface of the housing, the capacitive touch zone comprising a conductive component mounted to the circuit board, wherein the conductive component comprises a first portion mounted to the planar surface of the circuit board and a second portion extending beyond the peripheral edge of the circuit board at an angle to the planar surface, wherein the first portion of the conductive component is flat and is mounted parallel to the planar surface of the circuit board,
wherein the second portion of the conductive component is flat,
wherein the angle at which the second portion extends relative to the planar surface of the circuit board is selected such that the second portion extends substantially parallel to the surface of the housing at the touch zone, and
wherein the capacitive touch zone is configured to, upon the receipt of an appropriate input, one or more of: activate a compass display, initiate Bluetooth pairing activation, and generate a signal to the vehicle.

17. The rearview assembly of claim 16, wherein the conductive component is supported by the circuit board and the second portion is spaced apart from the housing.

18. The rearview assembly of claim 16, wherein the second portion of the conductive component extends at an angle relative to the planar surface of the circuit board of between 0° and 180°.

19. The rearview assembly of claim 16, wherein the second portion of the conductive component extends at an angle relative to the planar surface of the circuit board of substantially 90°.

* * * * *